United States Patent [19]

Grunwald et al.

[11] 4,110,147

[45] Aug. 29, 1978

[54] PROCESS OF PREPARING THERMOSET RESIN SUBSTRATES TO IMPROVE ADHERENCE OF ELECTROLESSLY PLATED METAL DEPOSITS

[75] Inventors: John J. Grunwald, New Haven; Eugene D. D'Ottavio, Thomaston; Harold L. Rhodenizer, Bethlehem; Michael S. Lombardo, Waterbury, all of Conn.

[73] Assignee: MacDermid Incorporated, Waterbury, Conn.

[21] Appl. No.: 756,428

[22] Filed: Jan. 3, 1977

Related U.S. Application Data

[60] Continuation-in-part of Ser. No. 669,909, Mar. 24, 1976, abandoned, which is a continuation of Ser. No. 197,165, Nov. 9, 1971, abandoned, which is a division of Ser. No. 889,472, Dec. 31, 1969, Pat. No. 3,620,933.

[51] Int. Cl.² .................................................. C09J 5/00
[52] U.S. Cl. ..................................... 156/306; 156/151; 156/902; 156/630; 204/30; 204/38 A; 204/33; 204/146; 427/98; 428/418; 428/901

[58] Field of Search ............. 156/150, 344, 151, 629, 156/247, 630, 249, 665, 306, 667, 316, 902; 428/418, 461, 457, 462, 460, 901; 427/98, 327, 304; 204/20, 41, 30, 58, 33, 141.5, 38 A, 146; 148/6.15 R; 134/41

[56] References Cited

U.S. PATENT DOCUMENTS

| 2,552,285 | 5/1951 | Knewstubb et al. | 156/151 |
|---|---|---|---|
| 2,768,923 | 10/1956 | Kepple et al. | 428/901 |
| 2,798,037 | 7/1957 | Robinson | 204/58 |
| 2,932,599 | 4/1960 | Dahlgren | 156/630 |
| 3,305,416 | 2/1967 | Kahan et al. | 156/630 |
| 3,617,613 | 11/1971 | Benzinger et al. | 156/299 |
| 3,697,319 | 10/1972 | Feldstein | 427/304 |

*Primary Examiner*—William A. Powell
*Assistant Examiner*—J. J. Gallagher
*Attorney, Agent, or Firm*—St. Onge, Mayers, Steward & Reens

[57] ABSTRACT

A process is disclosed comprising laminating an anodically treated aluminum surface against a thermoset plastic substrate, whereby the surface of the substrate after chemically removing the aluminum has an improved affinity for the adherence thereof of electrolessly deposited metal films.

5 Claims, No Drawings

PROCESS OF PREPARING THERMOSET RESIN SUBSTRATES TO IMPROVE ADHERENCE OF ELECTROLESSLY PLATED METAL DEPOSITS

RELATED APPLICATIONS

The present patent application is a continuation-in-part of copending application Ser. No. 669,909, filed Mar. 24, 1976, now abandoned, which was in turn a continuation of application Ser. No. 197,165, filed Nov. 9, 1971, now abandoned. That application was a division of application Ser. No. 889,472, filed Dec. 31, 1969, now U.S. Pat. No. 3,620,933, granted Nov. 16, 1971. Additional divisional applications relating to this invention include Ser. No. 197,161, now U.S. Pat. No. 3,784,440, granted Jan. 8, 1974; Ser. No. 197,164, now U.S. Pat. No. 3,798,096, granted Mar. 19, 1974; and Ser. No. 197,163, now U.S. Pat. No. 3,793,106 granted Feb. 14, 1974.

BACKGROUND OF THE INVENTION

1. Field of the Invention

This invention relates to a process by which plastic parts are formed against an anodically treated aluminum surface by lamination under heat and pressure, whereby the surface of the plastic part, after removal of the aluminum, has a high energy level and is peculiarly receptive to adherent coatings of metal film deposited thereon by standard additive or semi-additive electroless plating processes. The invention finds particular application in the production of electronic circuitboards.

2. Description of the Prior Art

Two distinct methods of manufacture of printed circuitboards for electronic equipment have, in general, been employed in the prior art. One is termed the "subtractive" method, while the other is called the "additive" procedure. The manufacture of a printed circuitboard by the subtractive method starts with a composite consisting of a sheet of insulating (e.g. plastic) material as a base or substrate, having adhered on one or both of its faces a thin copper foil on the order of 0.001 to 0.003 inch thick. This foil is secured to the insulating base by means of an appropriate adhesive and the application of heat and pressure in forming the composite blank circuitboard. The substrate or insulating base used to support the conductive foil is generally made in the form of a flat sheet of compression molded epoxy, phenolic, polyester or other thermosetting resin material, with or without glass fiber or other reinforcement. In preparing a printed circuitboard by the subtractive method, a suitable mask is applied over the foil covered surface or surfaces of the composite to define the desired printed circuit configuration, and the board is then introduced into a spray etching machine or equivalent in order to chemically dissolve away unmasked portions of the copper foil from the surface of the plastic. The resulting circuitboard containing the desired circuit configuration is then treated in various ways to prepare it for mounting of accessory electronic components, etc. The retained portions of the original metal foil thus serve as the conductor paths of the finished circuitboard.

A drawback of the foregoing subtractive method arises from the occurrence during the etching away of the non-circuit areas of a phenomenon known as "undercut" in the metal retaining on the board. Undercut is a term of art employed to describe the lateral undermining of the conductor paths in the resulting circuit pattern on the surface of the board. In fact, this phenomenon of undercutting greatly restricts the fineness or narrowness of the conductor paths that can be tolerated; that is, these conductor paths must be over-designed from a width standpoint to compensate for such undercutting. This of course impedes attempt toward further miniaturization of the circuitboards, an increasingly important consideration in electronic equipment design. Also, where the nature of the printed circuit requires the use of heavier or thicker copper foil on the surface of the plastic substrate, a longer residence time of the board in the etcher must be maintained, during which there is an inherent tendency for the masking material itself to be undermined also, or even partially removed in some areas of the board, thereby causing rejects.

Another major disadvantage of the subtractive method is that the copper-clad board is expensive, and in preparing the printed circuit board it is common for a large portion of the initial copper cladding to be completely etched away. Substantial quantities of etchant solution are utilized in the process, and the solutions must be replaced or rejuvenated periodically to maintain the efficiency of the etching operation. Furthermore, the depleted copper-laden etchant solutions present disposal problems and although they contain large amounts of potentially recoverable copper, the reclamation process involves additional expense so that any savings is of limited economic attractiveness. A further complication arises from the fact that generally the waste etchant solutions cannot simply be discarded without appropriate treatment to avoid pollution, which represents still another expense.

The alternative, i.e. the additive process of printed circuitboard manufacture differs from the subtractive process in that the circuitboards are prepared by directly depositing conductive metal in the desired circuit configuration directly on a suitably prepared plastic substrate. That is, conductor metal is applied to the substrate only where conductor paths are wanted. While this procedure eliminates all (or in the case of a semi-additive process, most) of the etching and waste disposal problems discussed above, it has been subject to problems of obtaining adequate adhesion between the chemically deposited conductive metal and the dielectric substrate. One of the earlier (semi-additive) procedures is described in "Transactions of the Institute of Metal Finishing", 1968, Vol. 46, Pages 194–197. The procedure described involves treating the entire surface of a bare substrate board with a "keying" agent, then plating a very thin initial deposit of electroless nickel over the entire surface to serve as an electrical "bus" for subsequent electroplating. The system then involves the further steps of applying and developing a resist for the desired circuit pattern, followed by additional metal plating by conventional electrodeposition techniques to build up the exposed areas serving as the conductor portions of the finished circuitboards. The resist is then stripped and the printed circuitboard is etched under carefully controlled conditions to remove the exposed regions of the initial metal "bus", leaving only the heavier plate, i.e. the circuit paths, on the finished board. This method has certain advantages, particularly by reason of its semi-additive characteristic in that this facilitates electrodeposition of electrically non-connected circuit patterns on the surface of the board. This enables a desired thickness of the circuit pattern to be built up more quickly than is generally practical with an all-electroless plating operation. However the process described in the article requires especially careful preparation and even application of the keying agent in order to obtain an effective and consistent result. Furthermore, there are problems in finding a suitable keying agent which has dielectric properties compatible with the end-use requirements of the finished circuitboard. And of course the etch-removal of the initial "bus" layer between circuit paths must be done carefully to avoid disintegration of the paths themselves.

Prior to the present invention other procedures for additive plating have included systems of preparing the surface of the resin substrate for electroless plating by a swell-and-etch process involving treatment of the plastic surface with various organic solvents to attack and partially soften the surface, after which the board is subjected to a strong oxidizing solution, for example a sulfuric-chromic acid mixture. This treatment is believed to cause chemical bonding sites to be produced on the surface of the substrate, which sites are sufficiently retained after further extensive rinsing and catalyzing operations to provide a receptive environment for the electrolessly deposited metal film and thereby enhance the adhesion of that film to the substrate. One such method is described in U.S. Pat. No. 3,698,940, granted Oct. 17, 1972. This and similar swell-and-etch systems are subject to the disadvantage of highly toxic and sometimes explosive vapor exposure to operating personnel during the solvent swell treatment, as well as the handling of the highly corrosive etchant materials.

Other additive plating systems have included proposals for incorporating finely divided metal powders or reducible metal salts directly in a surface layer on the plastic substrate in the molding of such substrate, which particles are intended to provide more receptive sites for the reception and retention of the electrolessly deposited conductor metals. Apart from the fact that this requires special molding procedures in the production of the plastic substrates, the dielectric properties of the substrate are adversely affected.

SUMMARY OF THE INVENTION

One of the primary objectives of this invention, accordingly, is to provide improved means for preparing an intermediate article of commerce comprising a laminate of aluminum foil and a thermoset resin substrate, which article is particularly adapted for use in producing printed circuitboards by additive electroless plating techniques after the aluminum foil has been chemically stripped from the resin substrate.

The invention offers the distinct advantage of providing an article of commerce whose critical surfaces are effectively protected during shipping and handling, up to the very moment when the circuitboard manufacturer begins his operation of depositing the electroless metal on the surface of the resin substrate to form the finished printed circuitboard. Not only does the aluminum foil serve in the protective capacity just mentioned, it simultaneously serves the dual, essential, function of topographically modifying the surface of the plastic substrate to be electrolessly plated, whereby to produce a surface having substantial improvement in terms of increased bonding or peel strength of the electroless metal deposit.

As will appear in more detail hereinafter, it has been found that aluminum or aluminum alloy foil anodized in phosphoric acid electrolyte develops a unique structure in the anodized surface of the foil, providing microscopic pores of such physical dimension and configuration that, when replicated in the surface of the resin substrate by the laminating process and that surface is then exposed by chemically stripping away the aluminum foil, the morphological change produced in the substrate surface appears to be uniquely adapted to match the functional diameter of the commonly used tin/palladium activator hydrosols and/or the subsequently developed copper, nickel or other electroless metal crystals whose formation is initiated in the plating solution by the presence of the activator sites. Better adhesion of the electrolessly deposited metal to the substrate is thus obtained.

PREPARATION OF THE ALUMINUM FOIL

In preparing the intermediate laminate product in accordance with the invention, thin aluminum sheet or foil is first treated anodically to develop a unique and characterizing oxide film on its surface, as discussed more fully hereinafter. Aluminum alloys such as aluminum-copper, aluminum-magnesium, aluminum-copper-magnesium-zinc, and the like wherein aluminum is predominant, as well as pure aluminum itself, may be utilized. The thickness of the foil may vary over a wide range from about 0.001 inch to 0.0098 inch, or more, but the thinner foils are preferred for economic reasons.

A characterizing feature of the invention is the formation on the surface of the aluminum foil of a porous oxide film of such nature that, when the foil is laminated to a partially cured resinous substrate, the resin surface is caused to reproduce in reverse image the topographical or morphological porosity characteristics of the oxide film. It is found by experience that different adhesion or peel strengths of the ultimately applied electroless copper, nickel, cobalt, etc. metals commonly employed in the electroless plating art are obtained, depending on the nature of the oxide film produced on the aluminum foil, and that in turn depends on the electrolyte employed. It is postulated that some electrolytes produce a better match between the size of the pores in the oxide film (and consequently the reverse reproduction thereof on the resin surface) and the molecular or crystalline dimensions (or functional dimensions) of the metal ultimately deposited electrolessly onto the resin surface; and that where such better match is achieved, a firmer interlocking and consequently a stronger bonding between the electrolessly deposited metal and the pores reproduced in the resin surface is obtained.

By experimentation it has been discovered that where tin/palladium activators are employed and nickel, copper or cobalt are the electroless metals, significantly better adhesion or peel strength is obtained between the substrate and the electroless metal deposit if the anodizing treatment of the aluminum foil is conducted in an aqueous phosphoric acid or acid phosphate salt electrolyte. More specifically, electrolytic baths containing from about 10% to 60% by weight of phosphoric acid, operated at temperatures of from around 70° to about 130° F. for from 1 to 30 minutes, or more, at a current density of around 10 a.s.f. (amperes per square foot) to 75 a.s.f., with applied voltages of from around 5 to 25, give good results. The presently preferred operating conditions within this range include anodizing at from 90° to 110° F. for 3 to 7 minutes at 25 to 55 a.s.f. in a bath containing 20% to 40% by weight of phosphoric acid.

PREPARATION OF LAMINATES

The laminates of the present invention can be prepared using a wide variety of plastic substrates well known in the art. Typical thermosetting resins which are useful are the phenolic type materials, such as the copolymers of phenol, resorcinol, cresol or xylenonol with formaldehyde or furfural. Polyesters, prepared by reacting dicarboxylic compounds with dihydric alcohols such as the reaction products of phthalic or maleic anhydride with mono-, di- or polyethylene glycols, form a suitable class of thermosetting resins. An especially valuable class of thermosetting resins include the epoxy resins, such as the reaction products of epichlorohydrin and bisphenol A.

Thermosetting resins employed in preparing one type of the novel laminates of this invention are incorporated with thin carrier sheets to form what is known as prepregs. In the prepregs the thermosetting resin is in a partially cured condition (i.e., B-stage) and is still fusible under heat and pressure. Resins in the B-stage can be completely cured by the application of sufficient heat and pressure to yield tough, infusible thermoset materials. As mentioned, the thin sheets of thermosetting resins employed, i.e., the prepregs, usually contain reinforcing elements or carriers which can be such materials as glass fibers, asbestos, mica, paper, nylon fiber, etc. Generally the reinforcing elements comprise from about 30% to about 60% by weight of the prepregs. A typical polyester or epoxy circuitboard substrate with a thickness of 0.125 ± 0.005 inch and a resin content of about 38 ± 2% is composed of 12 plies of glass fabric. The tensile strength of such a substrate is about 50,000 psi and the compression strength is about 62,000 psi (dry). The preferred reinforcing agent is glass fiber; glass fiber is herein defined as any fibrous glass unit including filament yarns, rovings, reinforcing mats, stable yarns, woven fabrics and chopped fibres. Woven fabrics of glass cloth may be heat treated or chemically treated with a chrome acrylate complex, an amine functional silane or an epoxy functional silane which act as coupling agents between the glass and the resin and improve the adhesion of the resin binder and the glass.

In the process of this invention any thermosetting resin capable of forming a B-stage or partially cured resin which is essentially tack-free and still fusible under heat and pressure, and which is capable of being further cured by application of heat and pressure to give a tough and fusible thermoset resin substrate, can be used. A wide variety of thermosetting resins useful in preparing the laminates of this invention are unknown in the art. For example, suitable phenolic resins are described in U.S. Pat. Nos. 2,606,855; 2,622,045; 2,716,268 and 2,757,443. Suitable epoxy resins and polyester resins are described in U.S. Pat. Nos. 3,335,050; 3,399,268, etc. The preparation of a suitable prepreg sheet containing a thermosetting resin in the B-stage is described in U.S. Pat. No. 3,433,888.

A laminate suitable for use in the additive circuitboard process of this invention is prepared, for example, by placing a B-stage thermosetting epoxy coated and impregnated glass fabric sheet in a laminating press on top of a foil of aluminum having an anodically treated surface with that surface confronting the resin substrate, and then further curing the thermosetting resin under the influence of heat and pressure. If a double-faced laminate is desired, it can be prepared in the same manner by placing sheets of aluminum foil above and below the prepreg plies in the laminating press in such a way that the anodically treated surfaces confront the substrate. Where the finished laminate is clad on one side only, a sheet of aluminum foil (unoxidized) is utilized to prevent adherence or sticking of the resin substrate to the platen of the laminating press.

The actual bonding of the B-stage prepregs to the anodically treated aluminum surface(s) is accomplished by simultaneously pressing the laminating components together and baking at a temperature of about 250° F. to about 450° F., and preferably at 300° after 400° F., at a pressure of about 5 to 1,000 p.s.i.g., for a period of time ranging from about 5 minutes to 30 minutes. During the laminating process it may be necessary to water-cool the laminates under the pressure applied in order to promote temperature control of the resin during the curing cycle.

The metal foil thickness may be varied widely as previously pointed out although, preferably, it will be from about 0.001 inch to about 0.003 inch in thickness. In a like manner, the thickness of the thermosetting or thermoplastic resin substrate utilized may vary from about 0.015 inch to 0.125 inch, or more, as by increasing the number of plies of prepreg in the laminating step.

The following examples illustrate the preparation of several laminates in accordance with this invention but are to be considered not limitive.

EXAMPLE I

A sheet of aluminum foil, having a thickness of about 0.002 inch, is immersed in an alkaline soak cleaner bath for 5 minutes at a temperature of 190° F. to remove surface grime and oils. The clean aluminum foil is then preferably etched in ammonium bifluoride at room temperature for 3 minutes, then treated anodically in an electrolytic bath containing 10% (weight) phosphoric acid for 10 minutes at a current density of 10 a.s.f. and at a temperature of 110° F.

The anodically treated aluminum foil is then placed in a laminating press on top of a stack, e.g. eight to ten, epoxy B-stage prepregs each having a thickness of about 0.003 inch. A sheet of cellophane is placed between the undersurface of the stack of prepregs and the platen in order to prevent sticking during the curing operation.

The press, pre-heated to a temperature of 350° F. is closed and the laminate components are heated at a pressure of about 5 p.s.i.g. for about 30 seconds, after which the pressure is raised 250 p.s.i.g. and curing is continued at the same temperature for about 15 minutes. The result is a laminate in which the aluminum foil is firmly attached on the surface to a cured, hard, infusible thermoset resin substrate.

EXAMPLE II

A sheet of aluminum having a thickness of about 0.001 inch is anodically treated in a bath containing 30% (weight) of phosphoric acid for about 1 minute at 40 a.s.f. and at a temperature of 90° F. Prior to the anodic treatment, the aluminum sheet is immersed in an alkaline soap cleaner for a period of about 10 minutes at 100° F. in order to remove surface soils.

Two sheets of the thus-anodically treated aluminum are placed above and below a stack of partially cured XXXP phenolic (B-stage) prepregs on the platen of a laminating press. Each of the aluminum sheets is disposed so that its anodically treated surface confronts the plastic substrate. The laminate is then formed by heating the stacked components at a pressure of about 500 p.s.i.g. and a temperature of about 350° F. for 25 minutes. The result is a laminate clad on both sides with firmly bonded aluminum foil and a cured, hard, infusible phenolic substrate.

EXAMPLE III

In this example a sheet of aluminum foil having a thickness of 0.003 inch is first immersed in a solution of trichloroethylene at room temperature for about 1 minute, following which it is etched in 30% (volume) hydrochloric acid for 15 seconds at 85° F. The thus-cleaned aluminum foil is then anodically treated in a bath containing about 60% by weight of phosphoric acid at 50 a.s.f. for about 5 minutes at 75° F.

Two sheets of the anodically treated aluminum foil are placed above and below a stack comprising several plies of an epoxy resin (B-stage) prepreg wherein the epoxy is prepared from epichlorohydrin and bisphenol A in the presence of an acid curing agent. The B-stage resin prepregs are self-supporting, dry, non-tacky and non-adherent and can be handled without difficulty. The anodized aluminum foil sheets are placed in the laminating press in such a manner that their anodically treated surfaces respectively confront the stacked prepregs.

The laminating press is closed and the platens are heated gradually to a temperature of 350° F., after which the laminating components are maintained at that temperature for about 20 minutes at a pressure of 500 p.s.i.g.

Examination of the resulting laminate indicates that the aluminum sheets are strongly bonded to the cured thermoset substrate.

The foregoing examples each describe phosphoric acid as the anodizing electrolyte for treatment of the aluminum foil, and this is the preferred electrolyte. However, the soluble phosphoric acid salts may be substituted in whole or in part in equivalent amount for the acid, and is to be so understood in the interpretation of the appended claims.

PREPARATION OF PRINTED CIRCUITBOARDS

Aluminum-clad laminates prepared in accordance with any of the previously described Examples are used as the starting material in preparing printed circuitboards. In this procedure, the circuitboard manufacturer first subjects the aluminum-clad laminate to a stripping solution, such as hydrochloric acid or sodium hydroxide, to remove all of the aluminum foil from the surface or surfaces of the plastic substrate. Further details of such stripping operation are described in U.S. Pat. No. 3,620,933. This stripping operation is further supplemented by immersing the stripped substrate in a phosphoric acid solution, in accordance with the procedure taught specifically in U.S. Pat. No. 3,864,147. Following the stripping of the aluminum cladding, the substrate is catalyzed in conventional manner in a tin-paladium catalyst solution. Several different proprietary catalyzing solutions are available commercially and details of the procedure are well known in the art. See for example U.S. Pat. No. 3,532,518.

The catalyzed substrate may be processed in either of two ways to provide an adherent conductor metal circuit of desired configuration on its surface. Under one procedure, the catalyzed board is electrolessly plated with a thin, initial deposit of conductor metal over its entire surface, whereby to form a continuous "bus", followed by application of a suitable resist to define a desired circuit pattern and to permit subsequent build-up by electrolytic (or electroless) deposition in the circuit areas of additional conductor metal to provide the final total desired conductor thickness. This is termed a semi-additive process. Alternatively, the procedure may involve applying and developing a resist circuit pattern directly on the catalyzed substrate surface; then plating the circuit paths or areas only with conductive metal by electroless plating techniques. (Direct electrolytic plating in some circumstances may be possible, as described for example in U.S. Pat. No. 3,099,608, but is generally not as satisfactory). This procedure is known as the full additive plating procedure. Both procedures just described are used in practice, each having some inherent advantages that may make one preferable to an operator over the other in a particular application. For example, the first procedure mentioned provides a means of facilitating electrodeposition in the formation of the conductor circuit pattern, and this is inherently less expensive than an all-electroless deposition procedure. However, using this method requires a final brief etching step to remove the initial thin continuous electroless deposit or "bus" after the build-up of the circuit has been completed. Whichever of the two procedures here described is employed, the circuitboard is heated or baked at one or more points in its development to promote effective bonding between the conductor metal and the resin substrate. Such heating or baking operation can be carried out preliminary to or after application of the catalyzing step; after application of the continuous initial thin "bus" deposit; after application of the resist; after development of the resist circuit pattern; or after completion of the circuitboard. Heating or baking is not required at all of these stages, but is always required at least once, and is instrumental in obtaining good adhesion.

While the mechanism of better adhesion through starting with aluminum clad laminate and then chemically stripping all of such aluminum cladding from the substrate before electroless deposition is not yet well understood, it appears that some interaction involving or caused by the anodically treated surface on the aluminum foil at the metal-plastic interface during the laminating process is the reason for the greatly improved adhesion between the substrate and the final metal deposit, whereby consistent peel strengths are achieved of over five pounds per inch and in most cases substantially higher. It is believed that an essential aspect of the formation of a bondable surface is that the plastic is capable of flowing and conforming to the anodically treated surface and is accordingly topographically modified by the procedure described.

Some evidence is available to support the postulation mentioned above in respect to securing a better match between functional diameter of the activator and/or electroless metal particles on the one hand, and surface porosity of the plastic substrate on the other. For example, aluminum foil anodized in oxalic acid electrolyte, when used as the cladding sheet on the plastic substrate, does not produce a surface on the substrate to which electroless metal will adhere using conventional electroless plating techniques. Similarly, replicated substrate surfaces obtained from aluminum foil anodized in sulfuric and chromic acid electrolytes do not provide the same level of electroless metal peel strengths as do surfaces obtained using phosphoric anodized foil. Reference to published works on aluminum oxide films shows that, although there is a certain similarity between the films produced anodically by the different electrolytes mentioned, there are nevertheless substantial physical (dimensional) differences in the microstructure of the oxide film. As reported in "Aluminum", Vol. III, Van-Horn (1967), published by American Society for Metals, (Pages 641 et seq), investigation of the structural features of porous-type anodic films of aluminum show that the films or coatings consist of closely packed cells of oxide, predominantly hexagonal in shape, each of which contains a single, generally axial, pore. The pore size (i.e., diameter), although apparently independent of forming voltage, nevertheless varies according to the electrolyte employed. By way of example, the following data is reported.

TABLE 1

| Electrolyte | Pore Diameter (Angstroms) |
|---|---|
| 15% sulfuric acid, 50° F | 120 |
| 2% oxalic acid, 75° F | 170 |
| 3% chromic acid, 100° F | 240 |
| 4% phosphoric acid, 75° F | 330 |

TABLE 2

| Electrolyte | Volts | No. of pores per sq. in. $\times 10^9$ |
|---|---|---|
| 15% sulfuric acid, 50° F | 15 | 498 |
| | 20 | 334 |
| | 30 | 179 |
| 2% oxalic acid, 75° F | 20 | 230 |
| | 40 | 75 |
| | 60 | 37 |
| 3% chromic acid, 100° F | 20 | 140 |
| | 40 | 52 |
| | 60 | 27 |
| 4% phosphoric acid, 75° F | 20 | 121 |
| | 40 | 50 |
| | 60 | 27 |

As will be apparent from this data, the invention anodizing conditions favor formation of an oxide film having both maximum pore diameter and minimum number of cells per surface area (maximum cell size). Potentially, chromic acid electrolyte also comes close to meeting the invention conditions and indeed test results lend some support to this, in that electrolessly plated substrates prepared from chromic acid anodized aluminum foil clad laminates evidence some low or marginal degree of peel strength. This compares to essentially zero peel strength in the case of oxalic or sulfuric acid anodized aluminum foil laminates. In the case of chromic acid the known poisoning effect of trace amounts of chromates on electroless metal catalysts may well account for the fact that chromic acid anodized aluminum does not provide the final peel strength of electroless deposit achieved with the use of phosphoric anodized aluminum cladding. In other words, the trace contaminant problem inherent with chromic acid may be a countervailing factor, even though the physical dimensions of the oxide film seem close to those of phosphoric anodized film.

The foregoing discussion on possible explanations for the uniquely superior results obtained in the use of phosphoric anodized aluminum clad substrates is not to be taken as limiting or binding the appended claims to the postulated theory; it is here presented only as a basis for showing that there is evidence that a different topographically modified substrate surface is in fact produced in forming a laminate with phosphoric acid anodized aluminum than is produced by laminating the substrate with aluminum foil anodized in other types of electrolytes.

What is claimed is:

1. In a process of preparing an intermediate article of commerce comprising a laminate of aluminum foil and a thermoset resin substrate, which article is particularly adapted for use in producing printed circuit boards by additive electroless plating techniques after the aluminum foil has been chemically stripped from said resin substrate, the steps which comprise anodizing said aluminum foil in a phosphoric electrolyte to develop an aluminum oxide film on the surface of the foil which is to confront the surface of the substrate in said article;

placing said aluminum foil with its anodized surface confronting the surface of a substrate comprising a plurality of glass fiber reinforced, B-stage epoxy resin prepregs; and applying sufficient heat and pressure to complete the cure of said substrate and bond said foil thereto to produce said laminate.

2. The process as defined in claim 1, wherein said thermoset resin substrate is cured and bonded to said anodized foil under pressure of from 5 p.s.i.g. to 1000 p.s.i.g. for 5 minutes to 3 hours at a temperature of 250° to 450° F.

3. The process as defined in claim 1, wherein said aluminum foil is anodized in a phosphoric electrolyte containing the equivalent of from 10% to 60% by weight phosphoric acid at temperatures from 70° to 130° F. for from 1 to 30 minutes at current densities of from 10 a.s.f. to 75 a.s.f.

4. The process as defined in claim 3, wherein the anodizing conditions comprise phosphoric electrolyte concentration equivalent to 20% to 40% by weight phosphoric acid, anodizing temperature of from 90° to 110° F, and an anodizing time of 1 to 7 minutes at 25 to 55 a.s.f.

5. The process as defined in claim 3, wherein the anodizing conditions comprise phosphoric electrolyte concentration equivalent to 30% by weight phosphoric acid, anodizing temperature of 90° F., and an anodizing time of 1 minute at 40 a.s.f.

* * * * *